United States Patent
Pentakota et al.

(10) Patent No.: US 10,826,334 B2
(45) Date of Patent: Nov. 3, 2020

(54) ELECTROMAGNETIC RADIATION CONTROL FOR ISOLATED POWER TRANSFER PRODUCT

(71) Applicant: Silicon Laboratories Inc., Austin, TX (US)

(72) Inventors: Krishna Pentakota, Austin, TX (US); Huanhui Zhan, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 142 days.

(21) Appl. No.: 15/940,551

(22) Filed: Mar. 29, 2018

(65) Prior Publication Data

US 2019/0305608 A1 Oct. 3, 2019

(51) Int. Cl.
| | |
|---|---|
| *H02M 3/335* | (2006.01) |
| *H02J 50/70* | (2016.01) |
| *H01L 23/495* | (2006.01) |
| *H03B 5/12* | (2006.01) |
| *H02J 50/12* | (2016.01) |

(52) U.S. Cl.
CPC ........ *H02J 50/70* (2016.02); *H01L 23/49596* (2013.01); *H02J 50/12* (2016.02); *H02M 3/33576* (2013.01); *H03B 5/124* (2013.01); *H03B 5/1215* (2013.01); *H03B 5/1228* (2013.01); *H01L 23/49575* (2013.01)

(58) Field of Classification Search
CPC .... H03B 5/1228; H03B 5/1215; H03B 5/124; H02J 50/12; H02J 50/70; H02M 3/3385; H02M 2001/346; H02M 3/33576; H02M 3/338; H02M 1/44; H01L 23/49503; H01L 23/495; H01L 23/49575; H01L 23/49596

See application file for complete search history.

(56) References Cited

U.S. PATENT DOCUMENTS

| | | |
|---|---|---|
| 7,489,526 B2 | 2/2009 | Chen et al. |
| 7,679,162 B2 | 3/2010 | Dupuis et al. |
| | (Continued) | |

OTHER PUBLICATIONS

Analog Devices, Inc., "Dual-Channel, 2.5 kV Isolators with Integrated DC-to-DC Converter," Data Sheet ADuM5200/ADuM5201/ADuM5202, 2009-2012, 28 pages.

(Continued)

*Primary Examiner* — Carlos Amaya
*Assistant Examiner* — Esayas G Yeshaw
(74) *Attorney, Agent, or Firm* — Zagorin Cave LLP

(57) ABSTRACT

A power transfer device includes an oscillator circuit of a DC/AC power converter responsive to an input DC signal and an oscillator enable signal to generate an AC signal. The oscillator circuit includes a first node, a second node, and a circuit coupled between the first node and the second node. The circuit includes a cross-coupled pair of devices. The oscillator circuit further includes a variable capacitor coupled between the first node and the second node. A capacitance of the variable capacitor is based on a digital control signal. A first frequency of a pseudo-differential signal on the first node and the second node is based on the capacitance. The power transfer device further includes a control circuit configured to periodically update the digital control signal. A second frequency of periodic updates to the digital control signal is different from the first frequency.

20 Claims, 11 Drawing Sheets

(56) References Cited

U.S. PATENT DOCUMENTS

| | | | |
|---|---|---|---|
| 7,706,154 | B2 | 4/2010 | Chen et al. |
| 8,861,229 | B2 | 10/2014 | Alfano et al. |
| 8,878,560 | B2 | 11/2014 | Kuo et al. |
| 9,035,422 | B2 | 5/2015 | Khanolkar et al. |
| 9,537,581 | B2 | 1/2017 | Mills et al. |
| 9,698,654 | B2 | 7/2017 | Santos et al. |
| 9,812,989 | B1 | 11/2017 | Dupuis |
| 10,511,273 | B2 | 12/2019 | Al-Shyoukh |
| 2002/0150151 | A1 | 10/2002 | Krone et al. |
| 2003/0091140 | A1 | 5/2003 | Dupuis et al. |
| 2004/0057524 | A1 | 3/2004 | Krone et al. |
| 2004/0190670 | A1 | 9/2004 | Dupuis et al. |
| 2005/0100104 | A1 | 5/2005 | Dupuis et al. |
| 2006/0049881 | A1 | 3/2006 | Rein |
| 2007/0075813 | A1 | 4/2007 | Zhang |
| 2007/0080360 | A1 | 4/2007 | Mirsky |
| 2007/0139032 | A1 | 6/2007 | Dupuis et al. |
| 2007/0246805 | A1 | 10/2007 | Zhang et al. |
| 2008/0013635 | A1 | 1/2008 | Dupuis |
| 2008/0025450 | A1 | 1/2008 | Alfano et al. |
| 2008/0031286 | A1 | 2/2008 | Alfano et al. |
| 2008/0119142 | A1 | 5/2008 | Dupuis |
| 2008/0164955 | A1 | 7/2008 | Pfeiffer |
| 2008/0192509 | A1 | 8/2008 | Dhuyvetter |
| 2008/0260050 | A1 | 10/2008 | Dupuis |
| 2008/0267301 | A1 | 10/2008 | Alfano et al. |
| 2009/0017773 | A1 | 1/2009 | Dupuis et al. |
| 2010/0052826 | A1 | 3/2010 | Callahan et al. |
| 2010/0118918 | A1 | 5/2010 | Dupuis |
| 2014/0126254 | A1 | 5/2014 | Al-Shyoukh et al. |
| 2014/0153296 | A1 | 6/2014 | Pan |
| 2014/0177290 | A1* | 6/2014 | Zhang ............... H02M 3/33507 363/21.13 |
| 2014/0375138 | A1* | 12/2014 | Sako ....................... H02J 13/00 307/104 |
| 2015/0145446 | A1 | 5/2015 | Shitabo |
| 2015/0171901 | A1 | 6/2015 | Dupuis et al. |
| 2016/0036340 | A1 | 2/2016 | Kikuchi |
| 2017/0346406 | A1 | 11/2017 | Bucheru |
| 2018/0278229 | A1 | 9/2018 | Sankaran et al. |
| 2019/0068071 | A1* | 2/2019 | Jia ........................... H02M 1/14 |

OTHER PUBLICATIONS

Analog Devices, Inc., "Hot Swappable, Dual I2C Isolators with Integrated DC-to-DC Converter," Data Sheet ADM3260, 2013-2016, 19 pages.

Analog Devices, Inc., "Quad-Channel, 5 kV Isolators with Integrated DC-to-DC Converter," Data Sheet ADuM6400/ADuM6401/ADuM6402/ADuM6403/ADuM6404, 2009-2012, 28 pages.

Silicon Laboratories, "1MBPS, 2.5KVRMS Digital Isolators," Si86xx, 2015, 52 pages.

Silicon Laboratories, "5 KV LED Emulator Input, Open Collector Output Isolators," Si87xx, 2014, 39 pages.

Silicon Laboratories, "Dual Digital Isolators with DC-DC Converter," Si88x2x, Jul. 2015, 45 pages.

Tsai, C.T., and Chou, H.P., "A Synthetic Ripple Buck Converter with Dynamic Hysteretic Band Modulation," International Conference on Power Electronics and Drive Systems, PEDS 2009, pp. 170-174.

Fanori, L. and Andreani, P., "Class-D CMOS Oscillators," IEEE Journal of Solid-State Circuits, vol. 48, No. 12, Dec. 2013, pp. 3105-3119.

* cited by examiner

ELECTROMAGNETIC RADIATION CONTROL FOR ISOLATED POWER TRANSFER PRODUCT

BACKGROUND

Field of the Invention

This invention relates to isolation technology and more particularly to providing power across an isolation barrier.

Description of the Related Art

Unintentional emissions or incidental emissions from devices can interfere with operations of other electronics devices. Regional authorities issue technical standards regulating how much electromagnetic leakage is tolerable. For example, the Federal Communications Commission of the United States issued Title 47 Code of Federal Regulations Part 15, which includes regulations for unintentional emissions or incidental emissions of electronics devices advertised or sold in the United States. The International Special Committee on Radio Interference (Comité International Spécial des Perturbations Radioélectriques (CISPR)) implements similar international regulations. An isolated power transfer system that unintentionally radiates energy must satisfy the regulations applicable in a target market. Accordingly, techniques for controlling electronic emissions from an isolated power transfer product are desired.

SUMMARY OF EMBODIMENTS OF THE INVENTION

In at least one embodiment of the invention, a power transfer device includes an oscillator circuit of a DC/AC power converter responsive to an input DC signal and an oscillator enable signal to generate an AC signal. The oscillator circuit includes a first node, a second node, and a circuit coupled between the first node and the second node. The circuit includes a cross-coupled pair of devices. The oscillator circuit further includes a variable capacitor coupled between the first node and the second node. A capacitance of the variable capacitor is based on a digital control signal. A first frequency of a pseudo-differential signal on the first node and the second node is based on the capacitance. The power transfer device further includes a control circuit configured to periodically update the digital control signal. A second frequency of periodic updates to the digital control signal is different from the first frequency. The control circuit may be configured to generate the oscillator enable signal based on a feedback signal received across an isolation barrier. The oscillator enable signal may regulate an output DC signal of the power transfer device. The control circuit may be configured to generate the digital control signal based on the feedback signal. The control circuit may include a second oscillator circuit configured to generate a clock signal oscillating asynchronously to the pseudo-differential signal. The digital control signal may be generated based on the clock signal.

In at least one embodiment of the invention, a method for controlling electromagnetic radiation of a power transfer device includes converting an input DC signal into a first AC signal. The converting includes biasing an oscillator circuit with the input DC signal. The converting includes selectively enabling the oscillator circuit according to the oscillator enable signal to generate the first AC signal having a first frequency. The converting includes periodically updating a capacitance of the oscillator circuit using a digital control signal. The first frequency is different from a second frequency of periodic updates to the digital control signal. The method may include generating the digital control signal based on a feedback signal received across an isolation barrier. The method may include generating a pseudorandom digital signal and generating the digital control signal based on the pseudorandom digital signal.

In at least one embodiment of the invention, a method for controlling electromagnetic radiation of a power transfer device includes varying a first frequency of power transfer across an isolation barrier. The varying is based on a digital control signal. The method includes updating the digital control signal at a second frequency. The second frequency is different from the first frequency. The power transfer may be controlled based on a feedback signal received across the isolation barrier and the digital control signal may vary pseudo-randomly.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
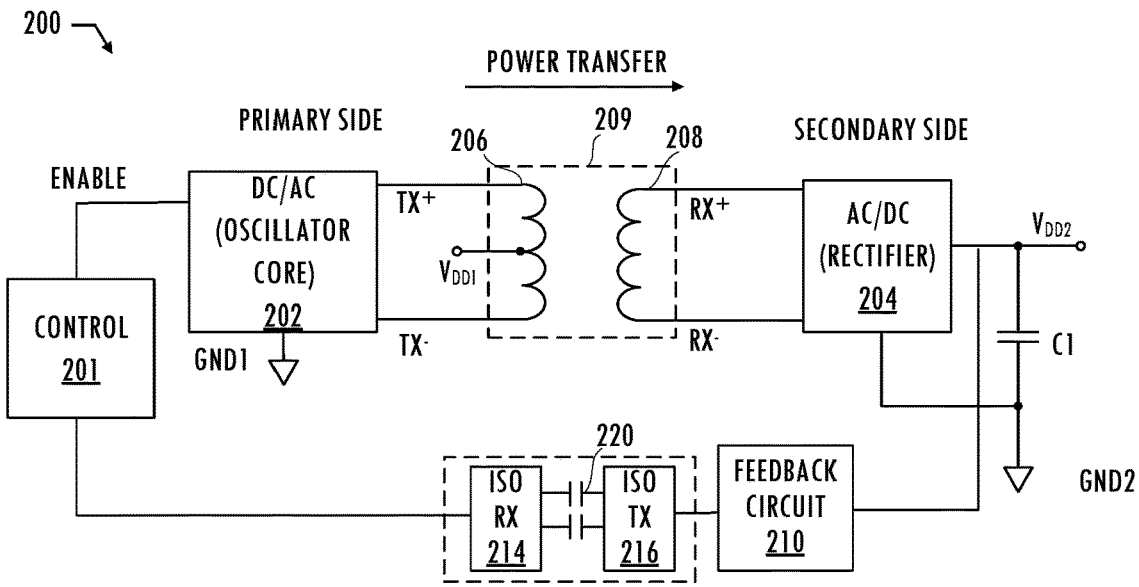
FIG. 1 illustrates a functional block diagram of a system for transferring power across an isolation barrier using feedback to regulate the output signal level.

Referring to FIG. 1, power transfer device 200 includes oscillator core 202 configured as part of a DC/AC power converter circuit and uses input DC signal $VDD_1$ to bias conductive coil 206 of transformer 209. AC/DC power converter circuit 204 uses conductive coil 208 of transformer 209 to drive capacitor C1. In at least one embodiment, an oscillator circuit includes conductive coil 206 and oscillator core 202 to form a fast-starting oscillator stage configured to operate as a Class-D power amplifier that is configured as a primary-side power converter stage. This primary-side power converter stage may be tuned to oscillate with a particular frequency, e.g., approximately 55 MHz-75 MHz, using variable capacitors. Control circuit 201 regulates output voltage $VDD_2$ by turning on and off oscillator core 202 using feedback information received from feedback circuit 210 via capacitive channel 220 to communicatively couple electrically isolated integrated circuits. Capacitive channel 220 communicates the feedback information across an isolation barrier from the secondary side to the primary side. The feedback may be provided as a digital signal communicated across the isolation barrier using transmitter 216 and receiver 214 that implement on-off keying (OOK) modulation of the information transmitted across the capacitive channel 220. Power transfer device 200 transfers power across the isolation barrier, providing a way to power up devices coupled to a secondary side of the power transfer device, and eliminating a need for an explicit DC-DC converter. Transformer 209 converts electrical energy to magnetic energy and back to electrical energy.

Figure 2:
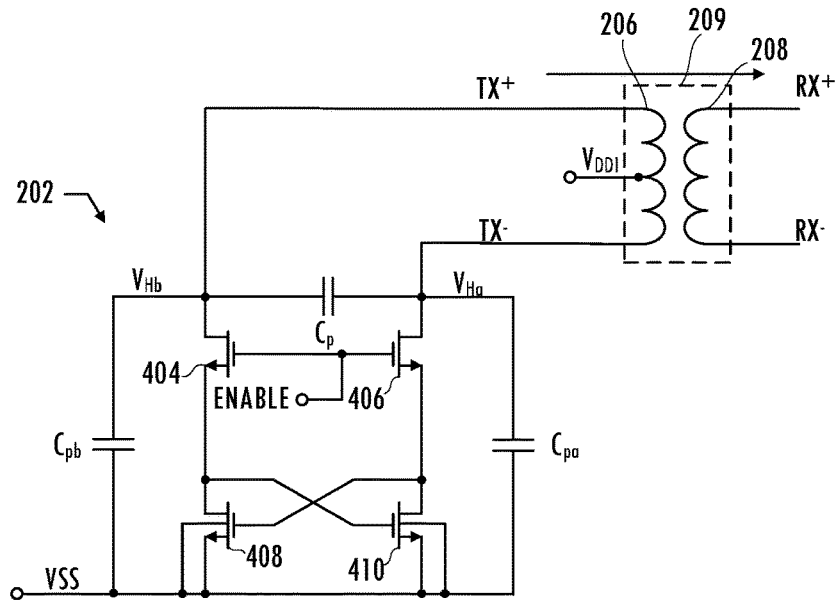
FIG. 2 illustrates an oscillator implemented in a system for transferring power across an isolation barrier.

FIG. 2 illustrates an exemplary oscillator core 202 configured to inject a high frequency current into the primary side of transformer 209 at a frequency $f_0=1/2\pi\underline{LC}$ and all its harmonics. The frequency of the current injected into the transformer is selected to allow transformer 209 to have a small physical size that fits in an integrated circuit package. However, the small physical size of transformer 209 increases the amount of high frequency AC current needed to drive the windings to deliver a target load power, as compared to transformers with larger size. That increased high frequency AC current through windings of transformer 209 increases the amount of radiation emitted by transformer 209, as compared to larger transformers. For example, to transfer approximately 500 mW of power across the isolation barrier requires approximately 350 mA root mean square (RMS) current at 65 MHz and approximately 100 mA RMS at 130 MHz, which causes substantial radiation at both 65 MHz and 130 MHz.

Figure 3:
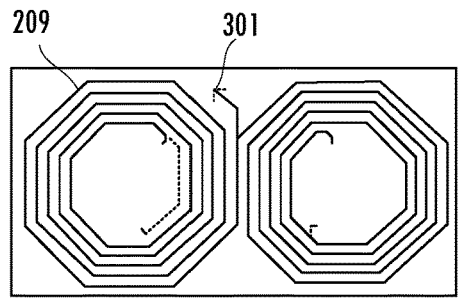
FIG. 3 illustrates an integrated circuit air-core transformer implemented in a system for transferring power across an isolation barrier of FIG. 1.

In at least one embodiment, transformer 209 is an air core transformer with a 1:N turns ratio, where N can be approximately one. Referring to FIG. 3, each conductive coil of transformer 209 includes two turns each and has a planar spiral structure. However, one of skill in the art will appreciate that the teachings herein can be utilized with other transformers using other turn ratios and/or other numbers of turns per coil. Transformer 209 converts the AC electrical energy on the primary side into magnetic flux, which is coupled into the secondary side of a power transfer device. Transferring energy from the primary side to the secondary side may require reinforced isolation, i.e., the primary and secondary sides of transformer 209 need to be able to withstand voltage surges greater than 5 kV RMS. Accordingly, the material used in the core of the transformer that isolates conductive coil 206 from conductive coil 208 needs to be able to withstand voltage surges greater than 5 kV RMS. Transformer 209 has a physical design and is formed using materials that reduce series resistance of conductive coil 206 and conductive coil 208 and improve the quality factor of the transformer 209, which increases the efficiency of transformer 209.

Exemplary EMI standards require radiated emissions to be controlled between 30 MHz and 1000 MHz. For example, in an exemplary application, the isolated power transfer system of FIG. 1 must satisfy at least one of the specifications of Table 1.

TABLE 1

| Acceptable emissions for a residential or home device in exemplary markets | | |
|---|---|---|
| Frequency of Emissions (MHz) | FCC Spec (field @ 3 m observation in dBuV/m) | CISPR Spec (field @ 10 m observation in dBuV/m) |
| 30-88 | 30 | 30 |
| 88-216 | 33.5 | 30 |
| 216-960 | 36 | 37 |
| above 960 | 36 | 37 |

Radiation of power transfer device 200 at both 65 MHz and 130 MHz (second harmonic) must have levels that fall within the applicable specifications (e.g., levels below 30 dBuV/m at 3 m observation and levels below 33.5 dBuV/m at 3 m observation, respectively). Assuming that, in operation, power transfer device 200 radiates fields that are far fields at the point of observation, as distance increases, the radiation field decreases linearly. To cancel far-field electromagnetic radiation, transformer 209 includes magnetically differential loops having current flowing in opposite directions. In addition, an external capacitor coupled between terminal 301 of transformer 209 of FIG. 3, and a terminal that forms an off-chip common mode loop is positioned proximate to the terminals to reduce the size of the off-chip common mode loop. Although such design techniques reduce the electromagnetic radiation from transformer 209 (e.g., at the fundamental frequency of oscillation), transformer 209 may still emit a substantial amount of electromagnetic radiation at harmonics of the frequency of oscillation that exceed emissions levels acceptable for those frequencies in a target market.

Figure 4:
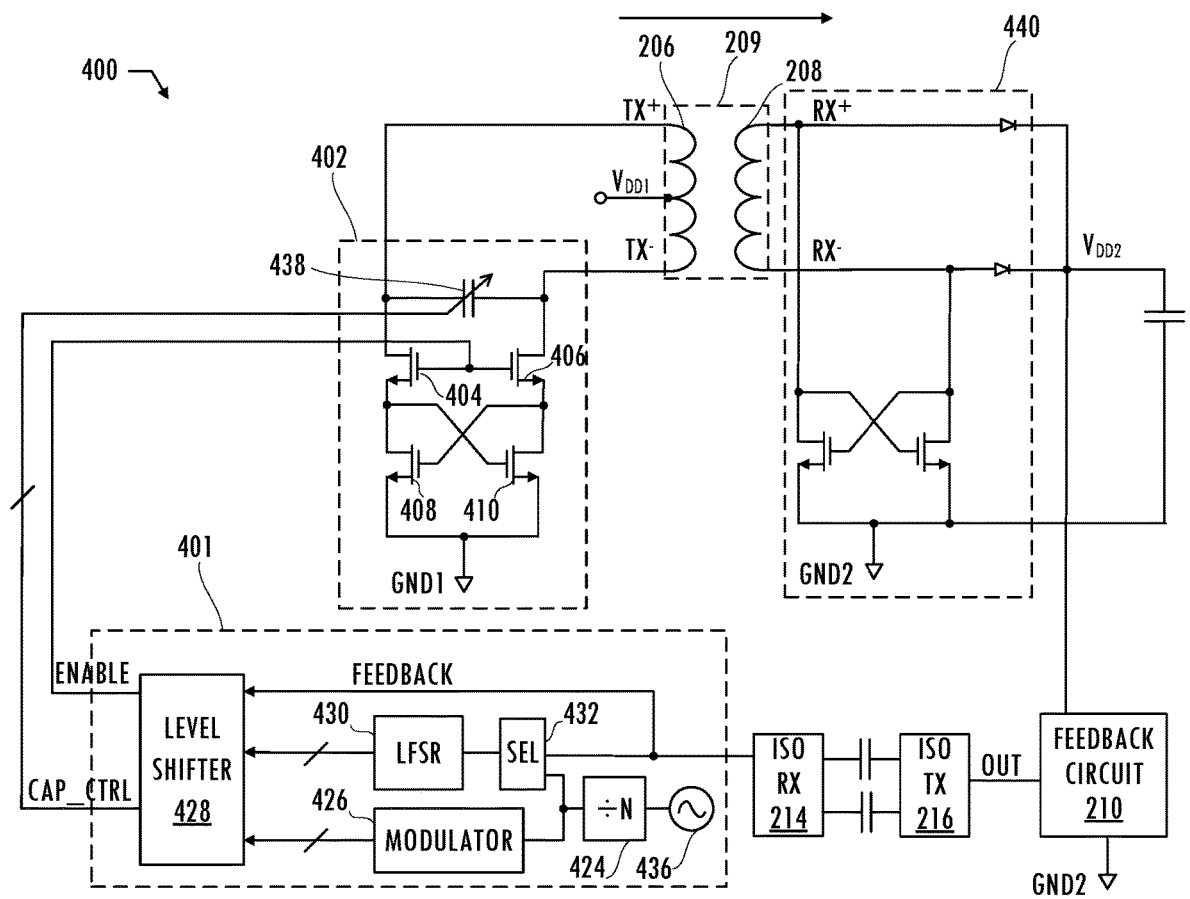
FIG. 4 illustrates a functional block diagram of a system for transferring power across an isolation barrier including features for controlling electromagnetic radiation of the system consistent with at least one embodiment of the invention.

A circuit design technique that reduces electromagnetic radiation of power transfer device as compared to power transfer device 200 of FIG. 2. Referring to FIG. 4, power transfer device 400 includes dynamically varying the frequency of the current injected into the primary side of the transformer and induced in the secondary side of the transformer. Changing the frequency of that current periodically reduces the amount of energy unintentionally emitted in a particular frequency band and distributes the unintentionally emitted energy across multiple frequency bands. Oscillator core 402 includes variable capacitor 438 that is responsive to a digital control signal to select an effective capacitance value and periodically update the effective capacitance value. For example, variable capacitor 438 includes an array of capacitors that are selectively enabled according to digital control signal CAP_CTRL. The array of capacitors may include a plurality of individually selectable capacitors, each having the same capacitance. In other embodiments, the array of capacitors includes a plurality of individually selectable capacitors having different capacitance values (e.g., binary weighted capacitance values). Variable capacitor 438 may include one or more capacitors that are not selectively enabled, but rather provide a predetermined capacitance that is either selectively increased by selectively enabling individual capacitors of the array and/or selectively decreased by selectively enabling individual capacitors of the array. The predetermined capacitance may provide a maximum capacitance value, a minimum capacitance value, a median capacitance value, or default capacitance value. Digital control signal CAP_CTRL and the selectable capacitor array provide an amount of programmability suitable for an intended application. For example, digital control signal CAP_CTRL is six bits wide for controlling an array of binary-weighted capacitors that are used to change a 65 MHz frequency by up to 6%, e.g., (fc−16×$\Delta f_{min}$≤f≤fc+16× $\Delta f_{min}$ where $\Delta f_{min}$ is 120 kHz to 130 kHz for fc of 65 MHz). Variable capacitor 438 can be fully differential, single-ended or a combination of fully differential and single-ended. Every 2 C units of capacitance on each single-ended branch is equivalent to C fully differential units.

If the rate of change to the frequency of the injected current (e.g., the frequency of updates to the digital control signal CAP_CTRL) occur at a frequency near the frequency of the injected current, the frequency changes will reduce circuit efficiency (i.e., reduce the power available to the load at the output of rectifier 440, as compared to the total electrical power consumed by the primary side of the transformer). However, the frequency of the injected current should be changed fast enough to prevent oscillator core 402 from generating a current that spends long periods oscillating at the same frequency. Accordingly, a suitable rate for updating the capacitance (i.e., a rate that changes frequently enough to reduce energy in any one frequency band of interest, but not too frequently to reduce efficiency) may be determined experimentally (e.g., a rate of 4 MHz to 6 MHz, which corresponds to an update period of approximately 167 ns to 250 ns).

Figure 5:
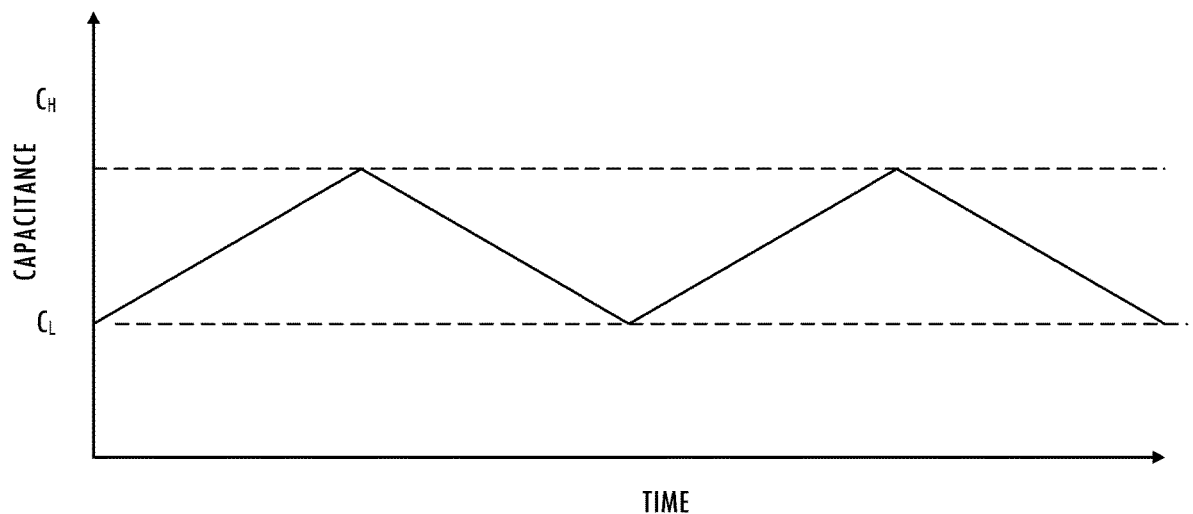
FIG. 5 illustrates a waveform for capacitance as a function of time consistent with at least one embodiment of the invention.
Figure 6:
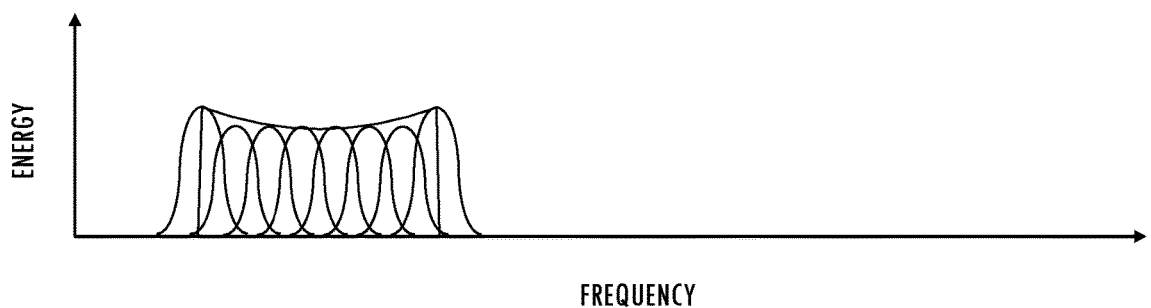
FIG. 6 illustrates a waveform for energy as a function of frequency consistent with at least one embodiment of the invention.

In at least one embodiment, power transfer device 400 generates digital control signal CAP_CTRL using a divided clock signal (e.g., a 6.25 MHz clock signal) provided by oscillator 436 (e.g., 25 MHz oscillator) and frequency divider 424 (e.g., divide-by-four or divide-by-two). Modulator 426 generates a multi-bit signal (e.g., a triangularly-modulated digital signal) based on the frequency-divided clock signal. Level shifter 428 converts the multi-bit signal and control signal FEEDBACK to digital control signal CAP_CTRL and control signal ENABLE, respectively, having an appropriate signal levels. Digital control signal CAP_CTRL updates variable capacitor 438 at the rate of the divided clock signal with values according to the triangularly-modulated digital signal. As a result, the capacitance of oscillator core 402 varies between a high capacitance level $C_H$ and a low capacitance level $C_L$, as illustrated in FIG. 5. Corresponding electromagnetic radiation is distributed across multiple frequencies, as illustrated in FIG. 6. However, note that the energy distribution of the outermost frequency bands may exhibit side peaks of electromagnetic radiation that may exceed an electromagnetic radiation specification in some applications.

Rather than using a fixed rate of update to variable capacitor 438 of oscillator core 402, in at least one embodiment, the feedback signal that controls enabling and disabling oscillator circuit 402 to regulate the output voltage has an appropriate frequency range (e.g., 2 MHz) for varying the capacitance of oscillator core 402. Accordingly, control circuit 401 updates the capacitance of oscillator core 402 by generating digital control signal CAP_CTRL based on control signal FEEDBACK, which is based on a feedback signal received across the isolation barrier. Using this technique to generate digital control signal CAP_CTRL, each time control signal FEEDBACK enables oscillator core 402, oscillator core 402 uses a different value of digital control signal CAP_CTRL (i.e., increases or decreases digital control signal CAP_CTRL), thereby injecting a current having a different frequency each time oscillator core 402 is enabled. However, similarly to the technique that triangularly modulates a divided clock signal, electromagnetic radiation may exhibit side peaks in the energy distribution. In addition, since the frequency of the feedback signal dependent upon the load condition, the reduction in electromagnetic interference depends upon the load condition, which may be undesirable in some applications.

Figure 7:
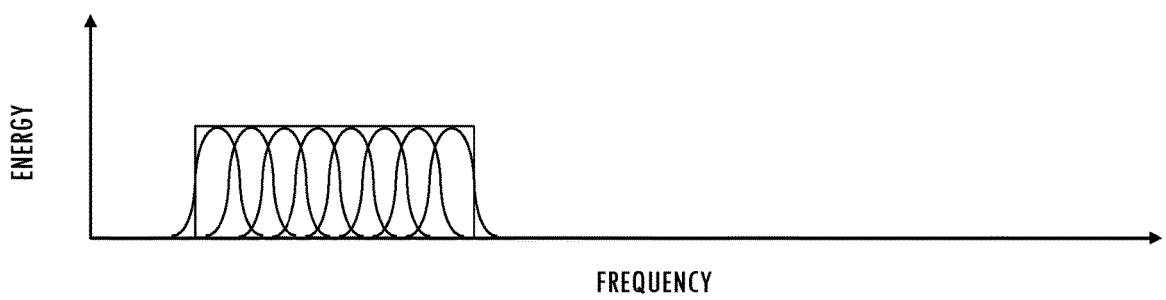
FIG. 7 illustrates a waveform for energy as a function of frequency consistent with at least one embodiment of the invention.

A technique that reduces the side peaks in the energy distribution randomizes the change to the frequency of oscillation using linear-feedback shift register 430 (e.g., a 6-bit linear-feedback shift register) to provide a pseudo-random value for digital control signal CAP_CTRL. Control circuit 401 updates digital control signal CAP_CTRL using a pseudo-random value that is updated using control signal FEEDBACK and is repeated only after a predetermined number of updates, which is based on the width of the linear-feedback shift register. Pseudo-randomly changing the capacitance of oscillator core 402 achieves a flatter energy distribution, as illustrated in FIG. 7. Reducing or eliminating side peaks in the electromagnetic radiation energy distribution, improves the electromagnetic radiation energy distribution to meet or improve margin of those emissions in regulated frequency bands. However, under some conditions, the feedback channel operates with loads that cause control signal FEEDBACK to have a frequency that is close to the frequency of oscillation of oscillator core 402. Rather than using control signal FEEDBACK to trigger linear-feedback shift register 430 to provide a next pseudo-random value, a divided clock signal having a suitable frequency, triggers linear-feedback shift register 430 to provide the next pseudo-random value.

In at least one embodiment, control circuit 401 monitors the load conditions based on the frequency of control signal FEEDBACK and causes select circuit 432 to select between control signal FEEDBACK and the divided clock signal to improve efficiency under some circumstances. Using the divided clock signal only for loads where control signal FEEDBACK has a frequency close to the frequency of oscillator core 402 actually increases efficiency in some applications although generation of the divided clock signal consumes power. The load condition presented to rectifier 400 determines the frequency of control signal FEEDBACK. A load drawing a relatively high current from the rectifier (e.g., a 50 Ohm load coupled to the output of the rectifier), near the upper limit of the power converter may reduce the frequency of control signal FEEDBACK as compared to loads drawing a moderate amount of current (e.g., 100 Ohm-500 Ohm loads). Accordingly, selection of the frequency of the update rate for changing the variable capacitor is a tradeoff between an update rate frequency that is sufficiently spaced from the frequency of oscillator core 402 and an update rate frequency that is high enough to reduce electromagnetic interference. An exemplary range for the update rate is hundreds of kilo-Hertz to tens of Mega-Hertz. Note that since oscillator core 402 is being used in a power transfer application that does not require strict clock edge integrity, the frequency of oscillator core 402 may be modulated as much as +/−10%, unlike a modulated clock application that requires strict clock edge integrity. In other embodiments, control circuit 401 does not include select circuit 432 and only the divided clock signal or the control signal FEEDBACK is used.

In at least one embodiment, the primary-side power converter stage formed by conductive coil 206 and oscillator core 402 operates as a high-efficiency Class-D power amplifier. Class-D operation may cause the pseudo-differential signal on nodes TX+ and TX− to have peak voltage levels (e.g., 15 V) up to, or slightly greater than, $3.2 \times V_{DD1}$. Such voltage levels are not tolerated by conventional CMOS devices (e.g., conventional CMOS transistors operate up to $1.2 \times V_{DD1}$). A conventional oscillator circuit that includes a latch circuit formed from conventional n-type transistors is inadequate to support the high gate-to-source voltage levels and drain-to-source voltage levels of the target specifications for the primary-side power converter stage.

In at least one embodiment, oscillator core 402 includes a latch circuit formed by latch transistor 408 and latch transistor 410, which are n-type transistors cross-coupled to each other and coupled to cascode transistor 404 and cascode transistor 406, which are also n-type transistors. Latch transistor 408 and latch transistor 410 are on the primary side (e.g., low voltage side) of the power transfer device and are configured to pump energy into the LC tank circuit including oscillator core 402 at a frequency that is determined by the passive system elements. Conductive coil 206 (i.e., the primary-side winding of transformer 209) can experience voltages as high as $3 \times V_{DD1}$ due to the Class-D mode operation (e.g., the pseudo-differential signal on nodes $V_{Ha}$ and $V_{Hb}$ having voltage levels in a range between $2.6 \times V_{DD1}$ and $3.2 \times V_{DD1}$) of oscillator core 402. Oscillator core 402 is selectively enabled via cascode transistor 404 and cascode transistor 406, which can cut off the current path to transformer 209. The Class-D operation of oscillator core 402 reduces transition times between the on (i.e., conducting) portion of oscillator core 402 and the off (i.e., non-conducting) portion of oscillator core 402, which realizes near-instant or near-zero voltage switching in the primary-side power converter stage, thereby increasing efficiency by limiting the time duration in which both n-type transistors consume power, and reducing or eliminating overshoots or undesired transients in the delivery of energy to the secondary-side power converter stage.

In at least one embodiment of oscillator core 402, cascode transistor 404 and cascode transistor 406 are laterally-diffused drain metal oxide semiconductor (LDMOS) transistors engineered for a high breakdown voltage. An exemplary LDMOS transistor can sustain high drain-to-source voltages (e.g., tens of Volts) while having low equivalent on-resistances ($R_{dson}$) in response to being driven into the linear mode of transistor operation. In at least one embodiment of the power transfer device, transistor 404 and transistor 406 are 18 V LDMOS n-type transistors, which are available in an exemplary manufacturing process for mixed-signal integrated circuits (e.g., a bipolar-CMOS-DMOS manufacturing process). Other transistors used by oscillator core 402 (e.g., latch transistor 408 and latch transistor 410) are conventional 5 V CMOS devices that have a breakdown voltage that is just over $V_{DD1}$ (e.g., a breakdown voltage in a range greater than 5 V, but less than 6 V). Cascode transistor 404 and cascode transistor 406 shield the latch circuit from high voltages. The drain terminals of cascode transistor 404 and cascode transistor 406 can support high drain-to-source voltage swings while corresponding gate-to-source voltages are maintained within reliability limits determined by gate oxide thicknesses of the transistors (e.g., $V_{gs}$<6 V).

For a voltage level of input DC signal $V_{DD1}$ equal to 5 V, drains of cascode transistor 404 and cascode transistor 406 will see voltages slightly higher than $3 \times V_{DD1}$=15 V. Cascode transistor 404 and cascode transistor 406 enable fast restart of the oscillator by presenting a sudden large voltage (e.g., a voltage above the latch crossover point, i.e., the point at which the gate-to-source voltage of latch transistor 410 equals the gate-to-source voltage of latch transistor 408) across latch transistor 408 and latch transistor 410. Voltages applied to latch transistor 408 and latch transistor 410 are precisely controlled so that those transistors enter the triode mode of operation and turn off at an appropriate time with little or no crossover time (i.e., the transition time when latch transistor 408 and latch transistor 410 are conducting in the active mode of operation). Each of latch transistor 408 and latch transistor 410 conducts during approximately one half of a cycle of the pseudo-differential signal on nodes $V_{Ha}$ and $V_{Hb}$ and does not conduct during the other half of the cycle.

Figure 8:
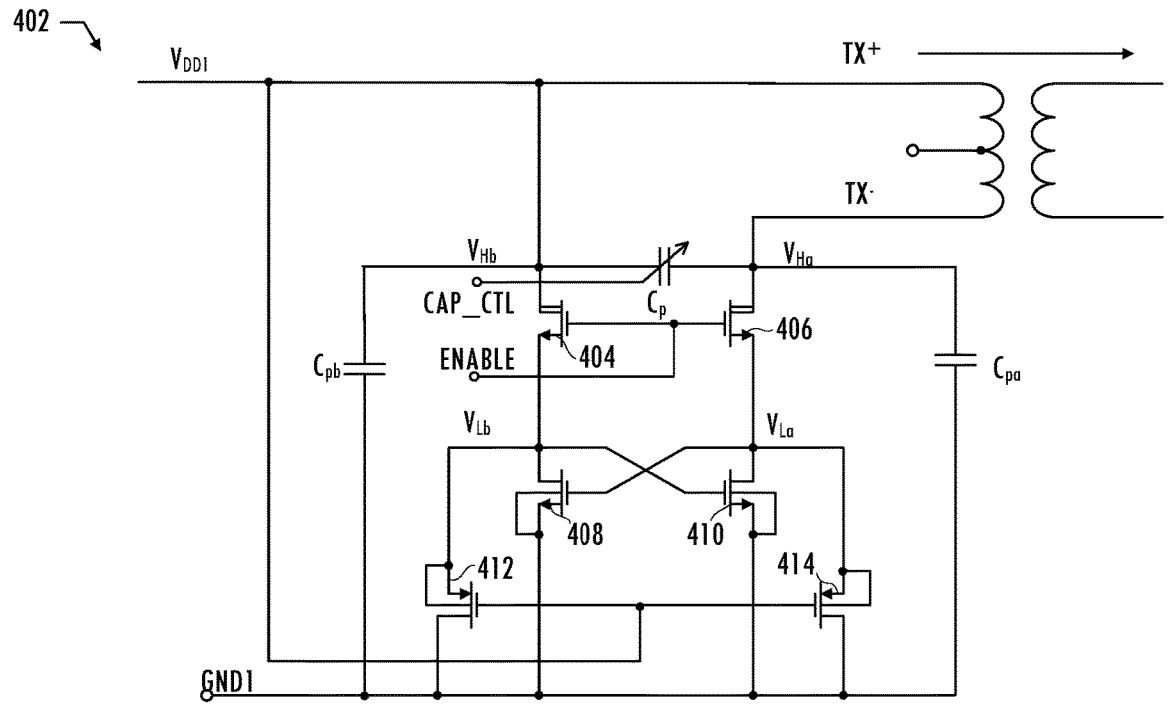
FIGS. 8-10 and 12 illustrate circuit diagrams of exemplary oscillator circuits for use in the system of FIG. 4 consistent with various embodiments of the invention.

Referring to FIG. 8, in at least one embodiment, oscillator core 402 includes clamp transistor 412 and clamp transistor 414 coupled to the gate terminal of latch transistor 410 and the gate terminal of latch transistor 408, respectively. Clamp transistor 412 and clamp transistor 414 limit the gate-to-source voltages of latch transistor 408 and latch transistor 410, respectively, to a maximum of approximately $V_{DD1}$+ $|V_{tp}|$. Clamp transistor 412 and clamp transistor 414 are p-type transistors configured to suppress any substantial coupling across the drain-to-source parasitic overlap capacitance of cascode transistor 404 and cascode transistor 406, respectively, if cascode transistor 404 and cascode transistor 406 try to lift the gate-to-source voltages of latch transistor 408 and latch transistor 410, respectively, above $V_{DD1}$+ $|V_{tp}|$. For an exemplary 5 V CMOS process, $V_{DD1}$ is 5 V and $|V_{tp}|$ is approximately 1 V, and the clamping occurs at approximately 6 V, which is close to the maximum gate-to-source voltage that a conventional 5 V transistor can withstand.

Figure 9:
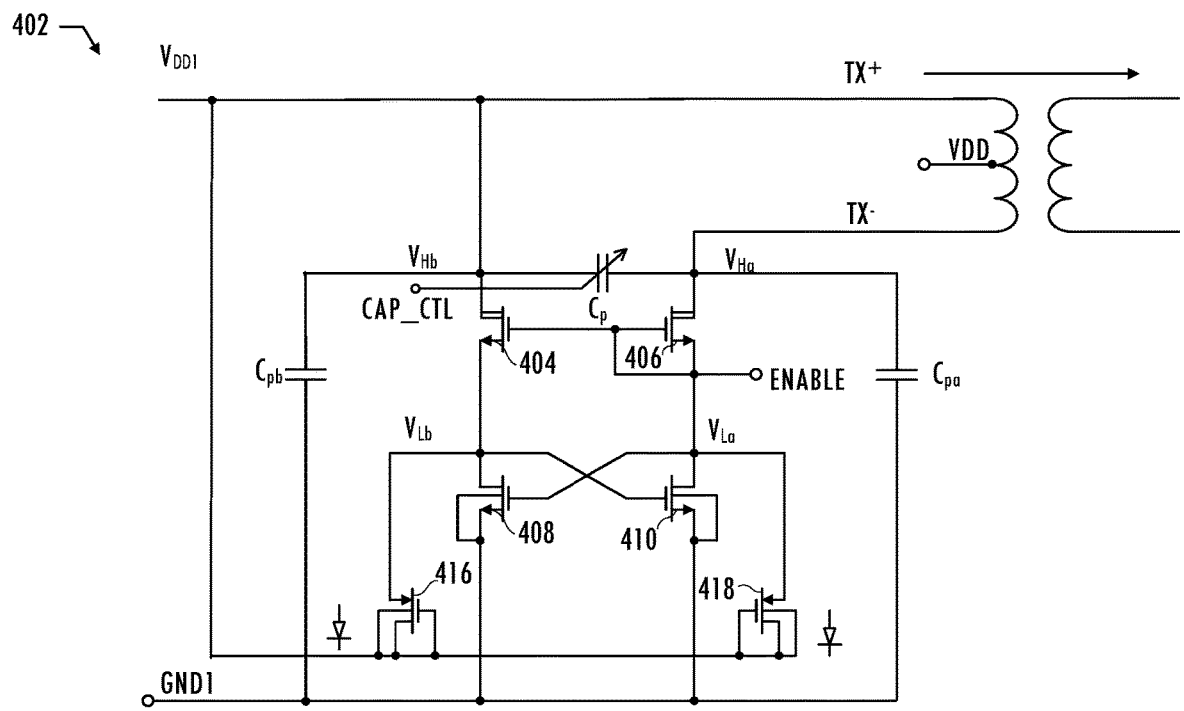

Referring to FIG. 9, in at least one embodiment, oscillator core 402 includes clamp transistor 416 and clamp transistor 418 having source terminals coupled to the gate terminal of latch transistor 410 and the gate terminal of latch transistor 408, respectively. Clamp transistor 416 and clamp transistor 418 each include a bulk terminal, a gate terminal, and a drain terminal that are coupled to the power supply node providing input DC signal $V_{DD1}$. Note that clamp transistor 416 and clamp transistor 418 are p-type transistors that have their n-type bulk terminal coupled to a corresponding drain node and not to a corresponding source node (i.e., a higher voltage node), as in typical clamp transistor configurations. The configuration of clamp transistor 416 and clamp transistor 418 results in two conduction paths for each clamp transistor: a channel conduction path and a body diode conduction path. Two conduction paths for each clamp transistor makes this configuration faster than the typical clamp transistor configuration. Clamp transistor 416 and clamp transistor 418 limit voltage $V_{La}$ and voltage $V_{Lb}$. If voltage $V_{La}$ or voltage $V_{Lb}$ exceeds input DC signal $V_{DD1}$, then both the channel diode and the body diode of clamp transistor 416 and clamp transistor 418 start conducting, thereby clamping the gate voltages of latch transistor 410 and latch transistor 408. Clamp transistor 416 and clamp transistor 418 are configured to return part of the clamped energy back to the power supply, thereby increasing the efficiency of oscillator core 402.

Figure 10:
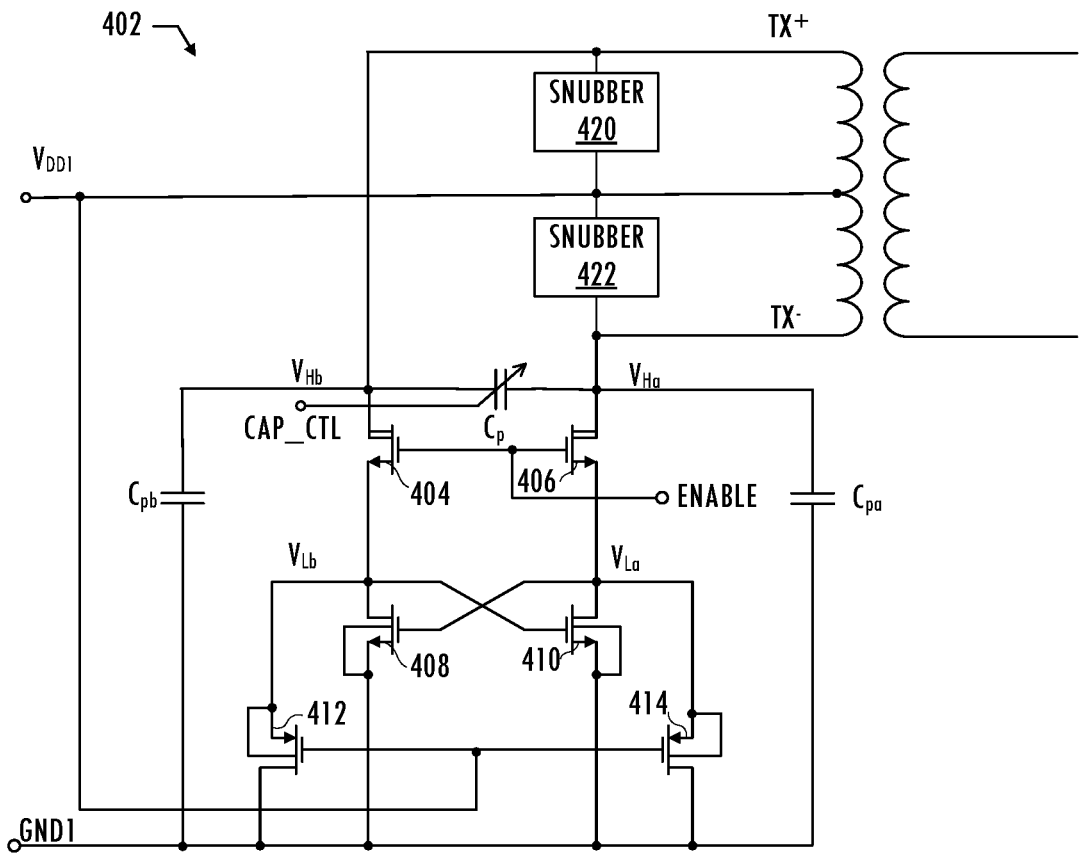
Figure 11:
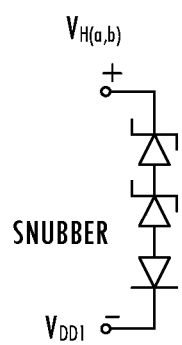
FIG. 11 illustrates a circuit diagram of an exemplary snubber circuit of FIGS. 10 and 12 consistent with embodiments of the invention.
Figure 12:
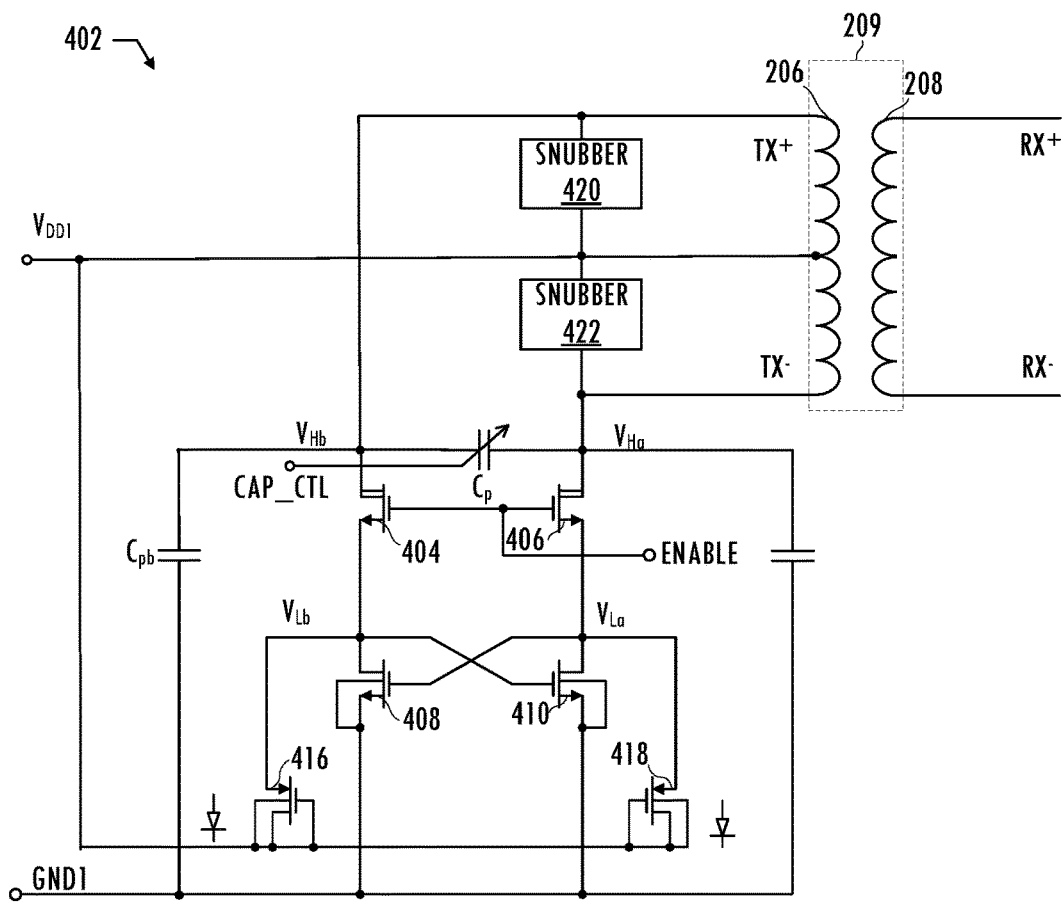
Figure 14:
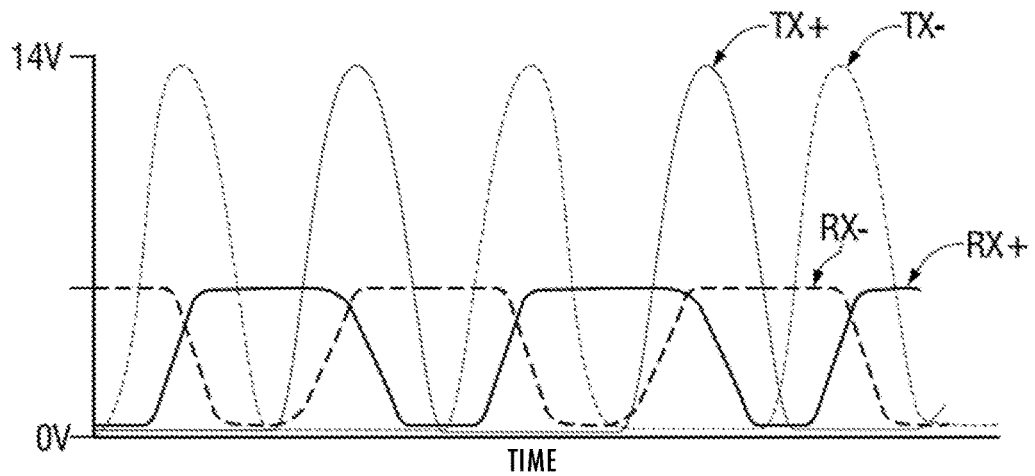
FIG. 14 illustrates exemplary signal waveforms for the isolated power transfer system of FIG. 4 consistent with at least one embodiment of the invention.
Figure 13:
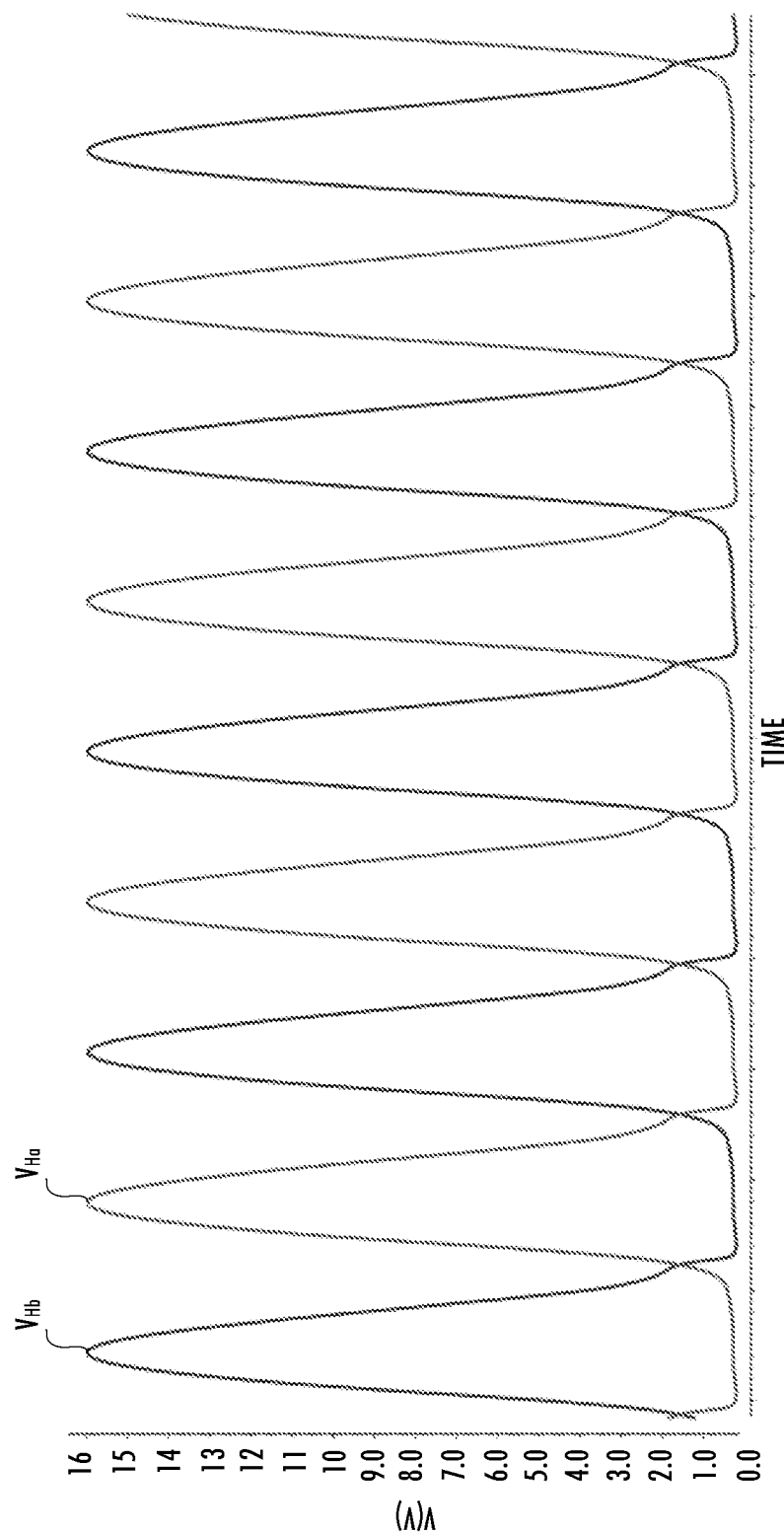
FIG. 13 illustrates exemplary signal waveforms of a pseudo-differential signal generated by an oscillator circuit of FIG. 4 consistent with various embodiments of the invention.

The enable mechanism for controlling oscillator core 402 may include a mechanism that reduces or eliminates excess energy that builds up in the transformer coils upon restart and that can cause flying voltages on the terminals of the transformer (i.e., voltage levels much greater than $3 \times V_{DD1}$ that develop as voltage $V_{Ha}$ or voltage $V_{Hb}$ as a result of releasing that excess energy to the capacitor(s) of the oscillator (e.g., $C_p$, $C_{pa}$, $C_{pb}$) as the oscillator restarts oscillating). Referring to FIGS. 10-12, embodiments of oscillator core 402 include snubber circuit 420 and snubber circuit 422 coupled to the drain terminal of cascode transistor 404 and the drain terminal of cascode transistor 406, respectively. Snubber circuit 420 and snubber circuit 422 prevent the voltage on the drain terminal of cascode transistor 404 and the voltage on the drain terminal of cascode transistor 406, respectively, from substantially exceeding $3 \times V_{DD1}$. As a result, snubber circuit 420 and snubber circuit 422 reduce or eliminate any non-fundamental modes of oscillation (i.e., modes of oscillation with an effective oscillation frequency other than $$f = \frac{1}{2\pi\sqrt{LC}})$$

and force clean, well-bounded oscillation of oscillator core 402. In addition, snubber circuit 420 and snubber circuit 422 return at least part of the excess energy to the power supply. Snubber circuit 420 and snubber circuit 422 may be sized to have a clamping voltage level just above $3 \times V_{DD1}$. In at least one embodiment of oscillator core 402, snubber circuit 420 and snubber circuit 422 each include series-coupled, reverse-biased Zener diodes coupled in series with series-coupled, forward-biased diodes. Accordingly, the clamping voltage level equals $N_1 \times V_Z + N_2 \times V_F$, where $N_1$ and $N_2$ are integers greater than zero, $V_Z$ is a knee voltage of the Zener diodes, and $V_F$ is a forward voltage of the forward-biased diodes. Referring to FIGS. 13 and 14, waveforms for oscillator core 402 illustrate pseudo-differential signals on nodes $V_{Hb}$ and $V_{Ha}$, TX+ and TX−, and RX+ and RX−.

Figure 15:
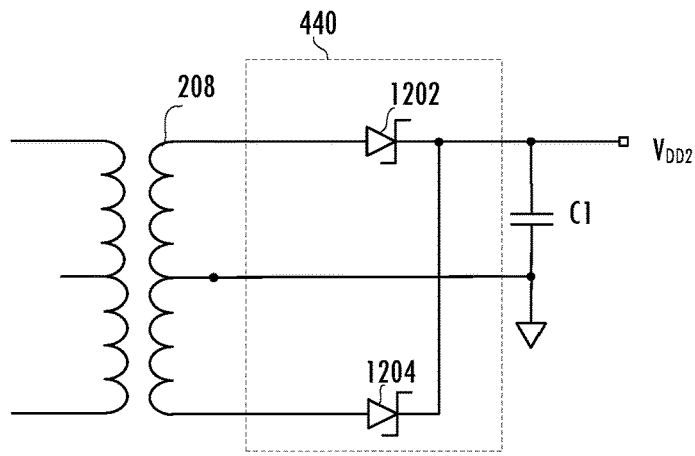
FIGS. 15-17 illustrate circuit diagrams of exemplary rectifier circuits for use in an isolated power transfer system consistent with various embodiments of the invention.

Referring to FIG. 4, oscillator core 402 converts input DC signal $V_{DD1}$ to an AC signal (e.g., the pseudo-differential signal on nodes TX+ and TX−). Transformer 209 converts that AC signal into a second AC signal (e.g., the pseudo-differential signal on nodes RX+ and RX−). AC/DC power converter circuit 440 receives the second AC signal from conductive coil 208 and converts the second AC signal (e.g., the pseudo-differential signal on nodes RX+ and RX−) into output DC signal $V_{DD2}$, which is electrically isolated from the input DC signal $V_{DD1}$. AC/DC power converter circuit 440 includes a full-wave rectifier circuit. Referring to FIGS. 4 and 15, in at least one embodiment, to improve the efficiency of power transfer device 200 and power transfer device 400 as compared to efficiency realized by conventional power transfer devices, conductive coil 208 includes a center tap coupled to a ground node and rectifier circuit 440 includes Schottky diode 1202 and Schottky diode 1204.

In general, a Schottky diode (i.e., hot carrier diode) is a semiconductor diode formed by a junction of a semiconductor with a metal and is characterized to have a fast switching speed and low voltage drop. The Schottky diode can sustain high forward currents at lower voltage drops than would exist in typical diffused pn-junction diodes. An exemplary Schottky diode forward voltage is approximately 150 mV-450 mV, while a typical silicon diode has a forward voltage of approximately 600 mV-700 mV. The lower forward voltage requirement improves system efficiency. Typically, Schottky diodes are not available in conventional CMOS manufacturing technologies because their manufacture requires additional mask layers and processing steps. However, Schottky diodes may be available with conventional CMOS devices in an exemplary mixed-signal integrated circuit manufacturing process (e.g., bipolar-CMOS-DMOS manufacturing process). Schottky diode 1202 and Schottky diode 1204 withstand voltages of greater than 10 V in a typical application. The secondary-side half-windings alternate rectifying and adding charge to capacitor C1. Since only half of the transformer delivers power to the output capacitor for a particular half-cycle, the output voltage that can be developed across C1 is limited. However, only one Schottky diode contributes to conduction losses according to which path is conducting at a particular time. Schottky diodes that have high current density and relatively low reverse breakdown voltage may be used to reduce area of the rectifier circuit. If Schottky diodes are not available, regular diodes may be used, but result in a lossier system.

Figure 16:
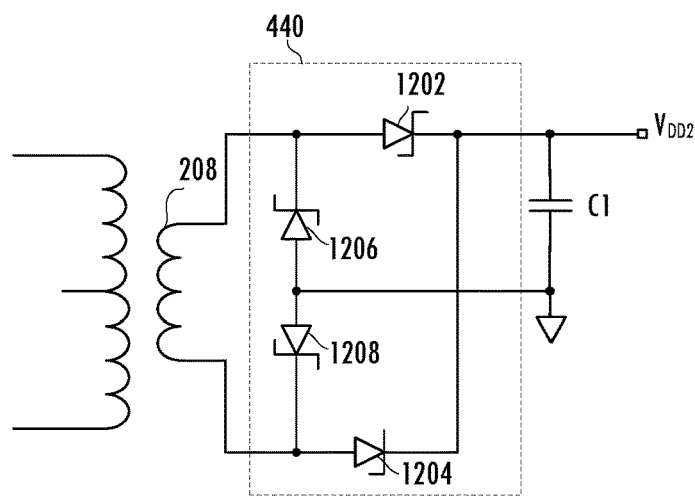

Referring to FIG. 16, in at least one embodiment of a power transfer device, rectifier circuit 440 includes conductive coil 208 with an unconnected center tap. Instead of a two-diode rectification structure, rectifier circuit 440 includes a four-diode rectification structure. Diode 1202, diode 1204, diode 1206, and diode 1208 are Schottky diodes, but regular diodes, which have higher losses across the diode, may be used. The embodiment of FIG. 16 allows a larger range of output voltage levels for output DC signal $V_{DD2}$ since the entirety of conductive coil 208 delivers energy to the load during each half-cycle, as compared to the embodiment of FIG. 15. However, the embodiment of FIG. 16 has increased conduction losses because the average output load current conducts across two diodes and incurs two diode forward-voltage drops, instead of one diode forward-voltage drop of the embodiment of FIG. 15.

Figure 17:
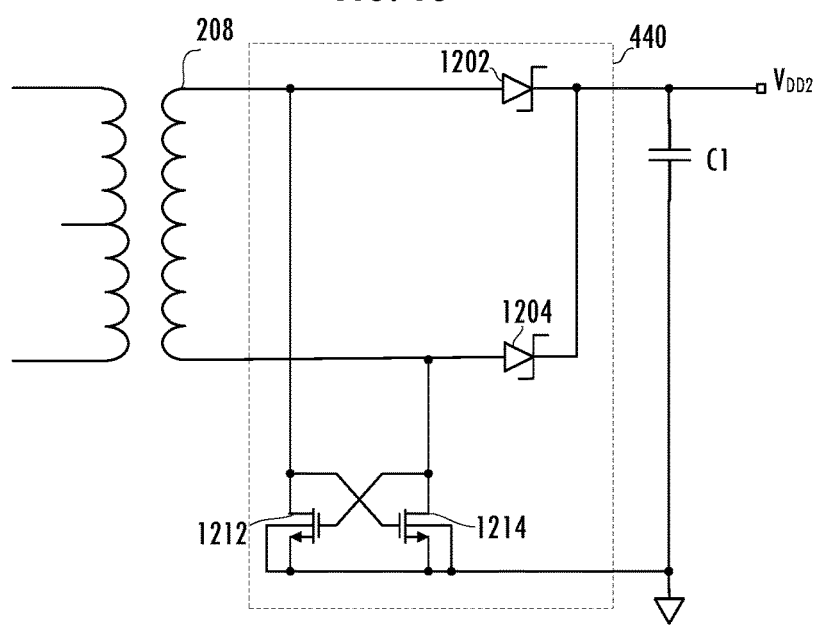

Replacing diode 1206 and diode 1208 of the embodiment of FIG. 16 with transistors 1212 and 1214 of FIG. 17, improves efficiency of rectifier circuit 440 by reducing conduction losses and the voltage drop across transistor 1212 and transistor 1214 can be made lower than the forward voltage drop of the Schottky diodes, as compared to the embodiment of FIG. 16. Referring to FIG. 17, in at least one embodiment, rectifier circuit 440 includes Schottky diode 1202 and Schottky diode 1204 integrated with conventional CMOS devices (e.g., cross-coupled n-type transistor 1212 and n-type transistor 1214). Conductive coil 208 is not coupled at a center tap. Regulating the output voltage level at an output DC signal $V_{DD2}$ such that $V_{DD2}+V_F$ falls below the maximum gate-to-source voltage of transistor 1212 and transistor 1214 alleviates reliability concerns related to the maximum gate-to-source voltage of transistor 1212 and transistor 1214. When either of transistor 1212 or transistor 1214 of FIG. 14 conducts (e.g., through the path through transistor 1214, conductive coil 208, and diode 1202 or the path through transistor 1212, conductive coil 208, and diode 1204), both the channel and the body diode of transistor 1212 conduct, thus reducing conduction losses as compared to the four-diode embodiment of FIG. 16.

Figure 18:
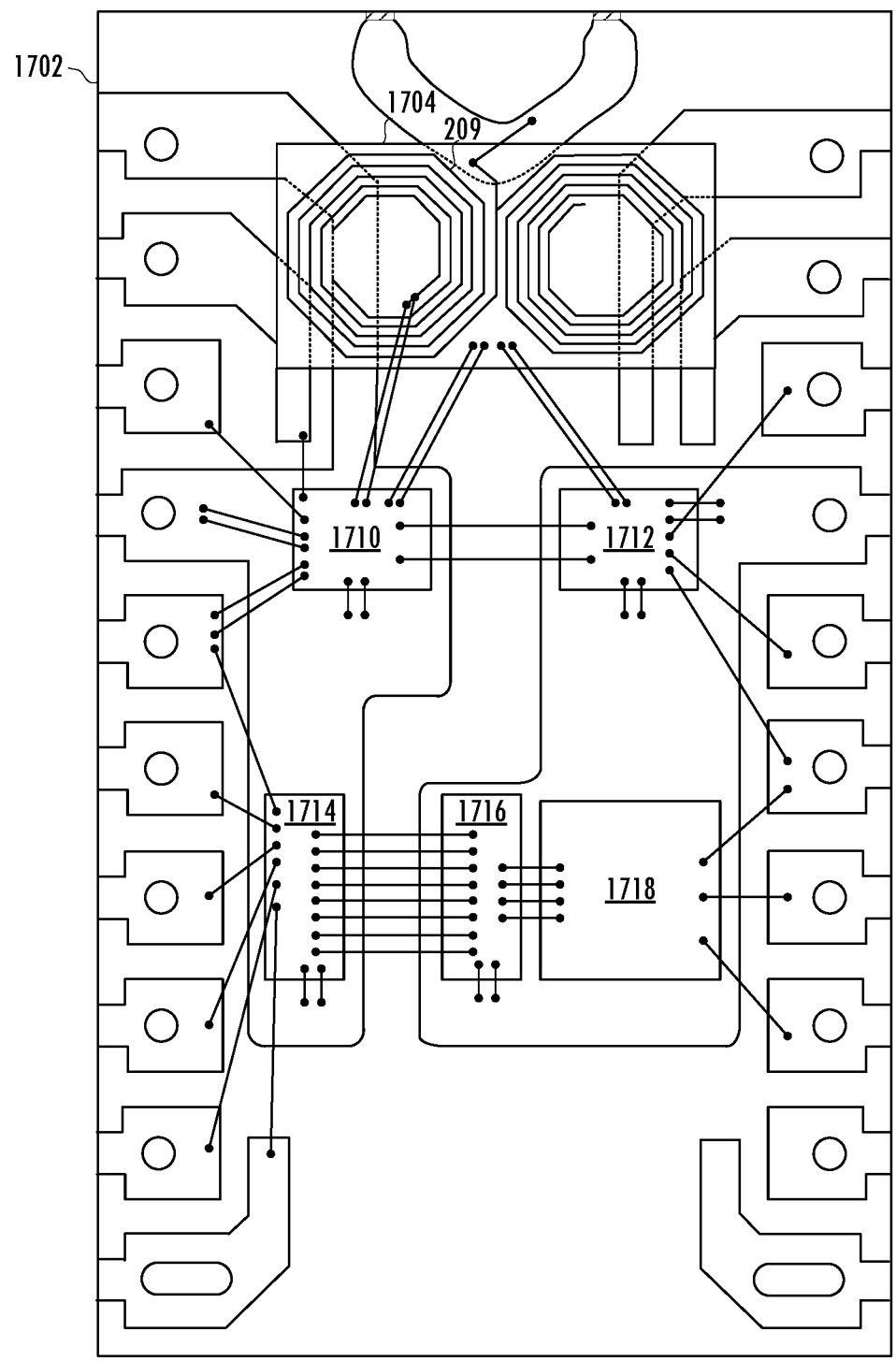
FIG. 18 illustrates a plan view of a packaged power transfer device consistent with at least one embodiment of the invention.

FIG. 18 illustrates a plan view of package 1702 housing an exemplary power transfer device. Integrated circuit 1710 includes oscillator core 402, integrated circuit 1712 includes rectifier circuit 440, integrated circuit 1718 includes feedback and fault tolerance circuitry, integrated circuit 1714 includes communication channel receiver circuitry, and integrated circuit 1716 includes communication channel transmitter circuitry. However, in at least one embodiment of power transfer device 400, circuits of integrated circuit 1712, integrated circuit 1716, and integrated circuit 1718 (e.g., rectifier circuit 440, feedback and fault tolerant circuitry, and isolation channel transmitter circuitry) are integrated in fewer integrated circuit die or a single integrated circuit die that are/is coupled to transformer device 1704. Similarly, in at least one embodiment of power transfer device 400, circuits of integrated circuit 1710 and integrated circuit 1714 (e.g., oscillator core 402 and communication channel receiver circuitry) are integrated in a single integrated circuit die that is coupled to transformer device 1704.

Referring to FIGS. 4 and 19-21, in at least one embodiment, feedback circuit 210 includes comparator 1902, which compares voltage $V_{SNS}$ on terminal SNS to reference voltage $V_{REF}$ (e.g., a reference voltage generated by a bandgap reference circuit). When comparator 1902 detects that voltage $V_{SNS}$ exceeds first threshold voltage $V_{DD2,MAX}$, which is based on reference voltage $V_{REF}$, the output of comparator 1902 changes output signal levels. In typical steady-state operation, transmitter 216 communicates the output of comparator 1902 from the secondary side to the primary side across the isolation barrier. The output of comparator 1902 may be converted to a modulated signal for transmission. For example, transmitter 216 uses an oscillator for on-off keying modulation to communicate a digital representation of the output of comparator 1902 across the capacitive channel to receiver 214. The primary side generates control signal ENABLE based on the received digital signal and controls oscillator core 402 accordingly (e.g., disables cascode transistors in oscillator core 402 to pause power transfer). When oscillator core 402 is disabled, a load on the secondary side starts to discharge capacitor C1. As a result, the voltage level of output DC signal $V_{DD2}$ drops at a rate equal to $$\frac{dVDD2}{dt} = -\frac{I_{load}}{C1}.$$

After the voltage level of output DC signal $V_{DD2}$ crosses second threshold voltage $V_{DD2,MIN}$, comparator 1902 changes the level of its output signal. The change in voltage level is communicated from the secondary side to the primary side across the isolation barrier. That change in level causes the primary side to enable oscillator core 402, which causes the voltage level of output DC signal $V_{DD2}$ to ramp up again. Output DC signal $V_{DD2}$ may have a small AC ripple at twice the oscillator frequency caused by the rectifier. That AC ripple is present only when oscillator core 402 is enabled and when the voltage level of output DC signal $V_{DD2}$ is ramping up to first threshold voltage $V_{DD2,MAX}$. An inherent delay of the received ON and OFF signals generated by on-off keying signaling causes a small DC offset of output DC signal $V_{DD2}$ that may be reduced by reducing delay of the feedback channel.

Figure 19:
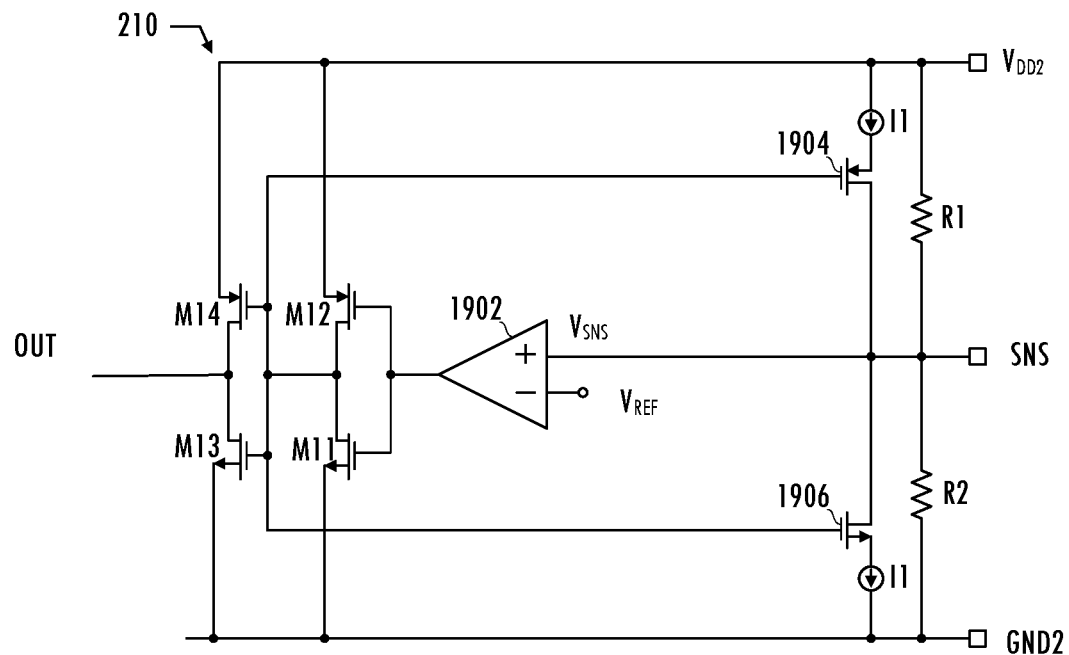
FIGS. 19 and 20 illustrate circuit diagrams of exemplary embodiments of the feedback circuit of FIG. 4 consistent with at least one embodiment of the invention.

Referring to FIGS. 4 and 19, the reference voltage $V_{REF}$ and the ratio of resistances of resistor R1 and resistor R2 determines the voltage level of output DC signal $V_{DD2}$ since $$V_{DD2} = V_{REF} \times \frac{(R1 + R2)}{R2}.$$

Hysteretic thresholds, first threshold voltage $V_{DD2,MAX}$ and second threshold voltage $V_{DD2,MIN}$ are programmed to target levels using a current I1 that is sourced by p-type transistor 1904 or sunk by n-type transistor 1906 to/from the resistor network including resistor R1 and resistor R2:

$$V_{DD2,MAX} = \frac{V_{ref}(R_1 + R_2)}{R_2} + I_1 R_1$$

$$V_{DD2,MIN} = \frac{V_{ref}(R_1 + R_2)}{R_2} - I_1 R_1.$$

Accordingly, a hysteretic band of the feedback signal is controlled independently of the voltage level of output DC signal $V_{DD2}$ by using analog techniques:

$$V_{HYS} = V_{DD2,MAX} - V_{DD2,MIN} = 2 \times I1 \times R1.$$

The power transfer device provides a fixed DC current to the secondary side and the load capacitor. At steady state, when the voltage level of output DC signal $V_{DD2}$ moves between first threshold voltage $V_{DD2,MAX}$ and second threshold voltage $V_{DD2,MIN}$, capacitor C1 charges at a constant rate of approximately $$\frac{dVDD2}{dt} = \frac{I_{out} - I_{load}}{C1}$$

and discharges at a constant rate of approximately $$\frac{dVDD2}{dt} = -\frac{I_{load}}{C1}.$$

At steady-state, $$\frac{dVDD2}{dt} = V_{HYS}.$$

Therefore, $$t_{off} = C1 \times \frac{V_{HYS}}{I_{load}}$$

and the frequency of enabling and disabling of oscillator core 402 to achieve voltage regulation is $$\frac{1}{t_{on} + t_{off}},$$

which is a function of C1, $V_{HYS}$, and $I_{load}$, and may vary according to particular manufacturing conditions. The frequency of the feedback channel may be adjusted by selecting appropriate values for C1 and $V_{HYS}$ for particular load conditions.

Figure 20:
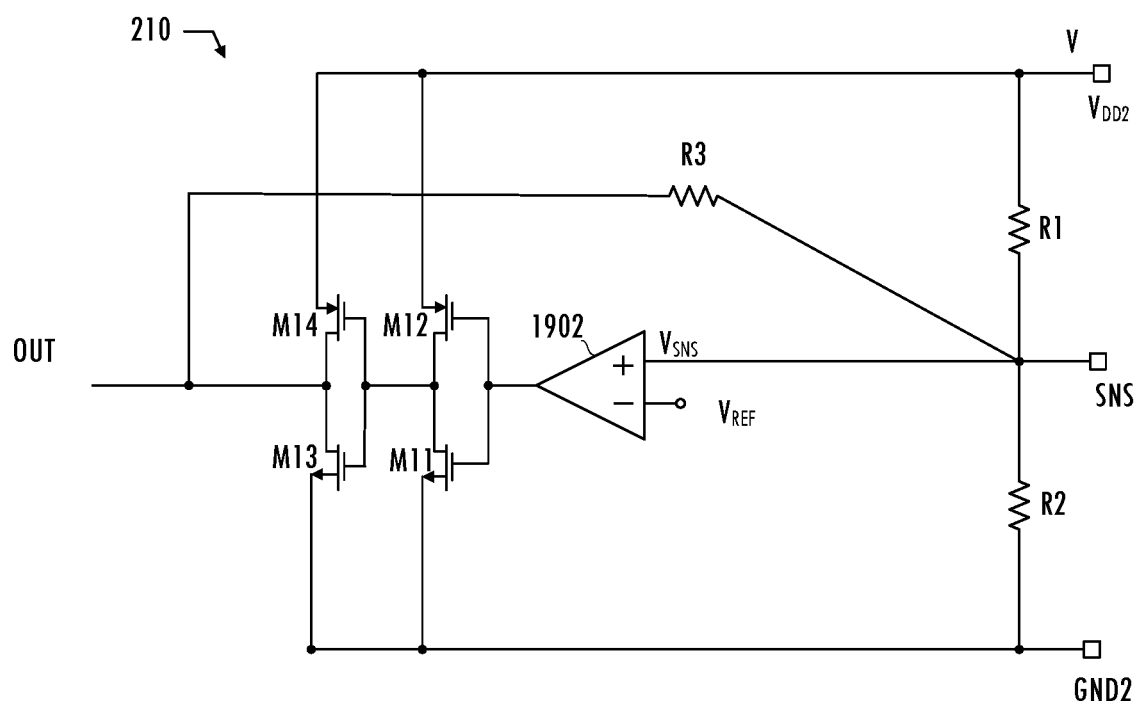
Figure 21:
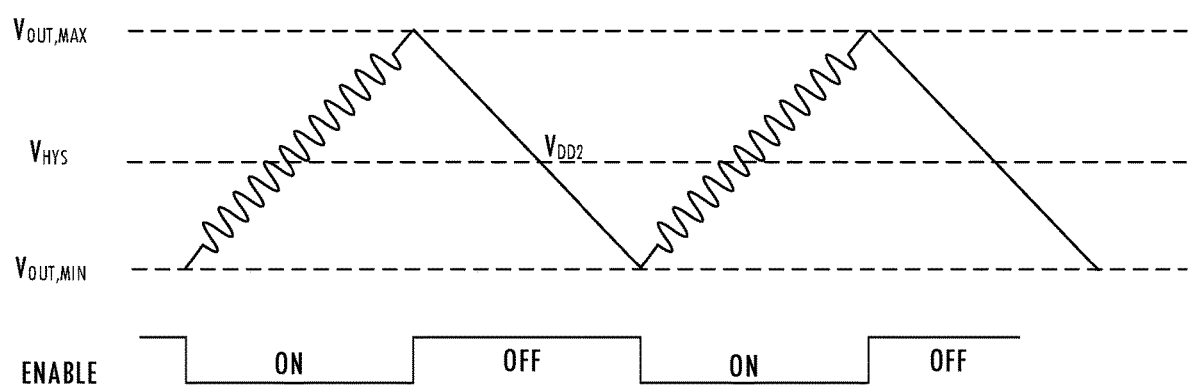
FIG. 21 illustrates exemplary signal waveforms for the isolated output voltage and the oscillator enable signal of FIG. 4.

Referring to FIG. 20, in at least one embodiment of feedback circuit 210, rather than using current sources, resistor R3, is included in addition to resistor R1 and resistor R2:

$$V_{DD2,MAX} = \frac{(R_1R_2 + R_1R_3 + R_2R_3)V_{ref}}{R_2R_3}; \text{ and}$$

$$V_{DD2,MIN} = \frac{V_{ref}(R_1R_2 + R_1R_3 + R_2R_3)}{(R_1 + R_3)R_2}.$$

Contrary to the embodiment described above where the average voltage level of output DC signal $V_{DD2}$ is defined by $$V_{REF} \times \frac{(R1 + R2)}{R2}$$

with a symmetrical hysteresis band $V_{HYS}=2\times I1\times R1$ evenly distributed around the average voltage level of output DC signal $V_{DD2}$, the upper and lower hysteresis thresholds of the embodiment of FIG. 20 are defined by more elaborate equations that are more complex to calculate. Nevertheless, the circuit provides the target upper and lower hysteretic thresholds using a simpler implementation. Resistor R3 may be included internally to the integrated circuit while resistor R1 and resistor R2 remain external to allow programmability of the hysteretic band and output voltage level using a single pin of the device by selection of first resistance of resistor R1 and second resistance of resistor R2. Additional embodiments of a power transfer device are described in U.S. patent application Ser. No. 15/835,234, filed Dec. 7, 2017, entitled "Isolated Power Transfer with Integrated Transformer and Voltage Control," naming Krishna Pentakota, Mohammad Al-Shyoukh, and Stefan N. Mastovich as inventors and U.S. patent application Ser. No. 15/835,230, filed Dec. 7, 2017, entitled "Power Transfer Using an Oscillator," naming Mohammad Al-Shyoukh, Krishna Pentakota, and Stefan N. Mastovich as inventors, which applications are incorporated herein by reference.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein, and as defined in the appended claims. In addition, the computer-readable media may store instructions as well as data that can be used to implement the invention. The instructions/data may be related to hardware, software, firmware or combinations thereof.

Thus, a power transfer device including electromagnetic radiation control has been described. The description of the invention set forth herein is illustrative and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. A power transfer device comprising:
   an oscillator circuit of a DC/AC power converter responsive to an input DC signal and an oscillator enable signal to generate an AC signal comprising:
   a first node;
   a second node;
   a circuit coupled between the first node and the second node, the circuit including a cross-coupled pair of devices; and
   a variable capacitor coupled between the first node and the second node, a capacitance of the variable capacitor being based on a digital control signal, and a first frequency of a pseudo-differential signal on the first node and the second node being based on the capacitance; and
   a control circuit configured to periodically update the digital control signal,
   wherein a second frequency of periodic updates to the digital control signal is different from the first frequency.

2. The power transfer device, as recited in claim 1, wherein the control circuit is configured to generate the oscillator enable signal based on a feedback signal received across an isolation barrier, the oscillator enable signal regulating an output DC signal of the power transfer device, and
   wherein the control circuit is configured to generate the digital control signal based on the feedback signal.

3. The power transfer device, as recited in claim 1, wherein the control circuit comprises a second oscillator circuit configured to generate a clock signal oscillating asynchronously to the pseudo-differential signal and the digital control signal is generated based on the clock signal.

4. The power transfer device, as recited in claim 3, wherein the control circuit further comprises a triangular modulator responsive to the clock signal, the digital control signal is generated based on an output of the triangular modulator, and the capacitance has a triangular variation with respect to time.

5. The power transfer device, as recited in claim 1, wherein the control circuit comprises a linear-feedback shift register, the digital control signal is generated based on an output of the linear-feedback shift register, and the first frequency varies pseudo-randomly.

6. The power transfer device, as recited in claim 5, further comprising:
   a select circuit responsive to a select signal to provide a feedback signal received across an isolation barrier or a locally-generated oscillating signal asynchronous to the AC signal to control the linear-feedback shift register.

7. The power transfer device, as recited in claim 1, wherein the second frequency is at least 50% less than the first frequency.

8. The power transfer device, as recited in claim 1, wherein the oscillator circuit further comprises a first conductive coil coupled to the first node and the second node to form a primary side circuit of the power transfer device.

9. The power transfer device, as recited in claim 1, wherein the oscillator circuit is configured to operate as a Class-D power amplifier.

10. The power transfer device, as recited in claim 1, further comprising:
a cascode circuit comprising transistors having a first conductivity type and a first breakdown voltage, the cascode circuit being coupled to the first node, and the second node,
wherein the pseudo-differential signal has a peak voltage of at least three times an input voltage level of the input DC signal, wherein each of the cross-coupled pair of devices has a breakdown voltage that is just over the input voltage level.

11. A method for controlling electromagnetic radiation of a power transfer device, the method comprising:
converting an input DC signal into a first AC signal, wherein the converting comprises:
biasing an oscillator circuit with the input DC signal;
selectively enabling the oscillator circuit according to an oscillator enable signal to generate the first AC signal having a first frequency; and
periodically updating a capacitance of the oscillator circuit using a digital control signal, the first frequency being different from a second frequency of periodic updates to the digital control signal.

12. The method, as recited in claim 11, further comprising:
generating the digital control signal based on a feedback signal received across an isolation barrier.

13. The method, as recited in claim 11, further comprising:
generating a pseudorandom digital signal; and
generating the digital control signal based on the pseudorandom digital signal.

14. The method, as recited in claim 13, further comprising:
selecting between a feedback signal received across an isolation barrier and a locally-generated oscillating signal asynchronous to the first AC signal to control update of the pseudorandom digital signal, the selecting being based on a frequency of the feedback signal.

15. The method, as recited in claim 11, further comprising:
generating an oscillating signal that is asynchronous to the first AC signal; and
generating the digital control signal based on a triangularly modulated version of the oscillating signal.

16. The method, as recited in claim 11, further comprising:
generating the oscillator enable signal based on a feedback signal received across an isolation barrier, the oscillator enable signal controlling an output DC signal of the power transfer device.

17. The method, as recited in claim 11, wherein the converting further comprises:
converting the first AC signal into a second AC signal, the first AC signal being electrically isolated from the second AC signal;
generating an output DC signal by rectifying the second AC signal, the output DC signal being electrically isolated from the input DC signal;
generating a feedback signal based on the output DC signal; and
communicating the feedback signal across an isolation barrier using a communications channel.

18. The method, as recited in claim 11, wherein the second frequency is at least 50% less than the first frequency.

19. A method for controlling electromagnetic radiation of a power transfer device, the method comprising:
varying a first frequency of power transfer across an isolation barrier based on an N-bit digital control signal, where N is an integer greater than one; and
updating a value of the N-bit digital control signal at a second frequency, the value of the N-bit digital control signal being updated using a pseudo-random value, the second frequency being different from the first frequency.

20. The method, as recited in claim 19, wherein the power transfer is controlled based on a feedback signal received across the isolation barrier.

* * * * *